(12) United States Patent
Unou et al.

(10) Patent No.: US 6,582,238 B2
(45) Date of Patent: Jun. 24, 2003

(54) PRINTED CIRCUIT BOARD WITH GROUND CORNER REGIONS

(75) Inventors: Takanori Unou, Kariya (JP); Hiroyuki Kawata, Chiryu (JP); Kimio Kobayashi, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/911,428

(22) Filed: Jul. 25, 2001

(65) Prior Publication Data

US 2002/0019155 A1 Feb. 14, 2002

(30) Foreign Application Priority Data

Aug. 10, 2000 (JP) ........................................ 2000-243282

(51) Int. Cl.$^7$ .............................................. H01R 12/00
(52) U.S. Cl. ............................ 439/68; 439/108; 439/55; 439/83; 439/92; 174/51; 361/803; 361/799
(58) Field of Search .................... 439/108, 68, 55, 439/83, 92; 361/760, 772, 777, 803, 799; 174/51

(56) References Cited

U.S. PATENT DOCUMENTS

| | | | | |
|---|---|---|---|---|
| 4,880,386 A | * | 11/1989 | Grabbe et al. | ................. 439/68 |
| 5,131,852 A | * | 7/1992 | Grabbe et al. | ................. 439/71 |
| 5,490,041 A | * | 2/1996 | Furukawa et al. | ........... 361/777 |
| 5,777,853 A | * | 7/1998 | Dorfmeyer | ................... 361/777 |

FOREIGN PATENT DOCUMENTS

JP          A-10-223997          8/1998

* cited by examiner

Primary Examiner—P. Austin Bradley
Assistant Examiner—Truc Nguyen
(74) Attorney, Agent, or Firm—Posz & Bethards, PLC

(57) ABSTRACT

Plural pins are arranged on a printed circuit board to form a generally square shape and are electrically connected to terminals of a QFP-IC. In the pins, a pin disposed at a corner portion of the generally square shape is used as a GND terminal, and a pin adjoining the GND terminal is used as a source terminal. A conductive region is provided to extend radially from the corner portion, and is electrically connected to the ground terminal. Further, another conductive region is provided in the generally square shape and is electrically connected to the radial conductive region.

30 Claims, 8 Drawing Sheets

PRINTED CIRCUIT BOARD WITH GROUND CORNER REGIONS

CROSS REFERENCE TO RELATED APPLICATION

This application is based upon and claims the benefit of Japanese Patent Application No. 2000-243282 filed on Aug. 10, 2000, the contents of which are incorporated herein by reference.

BACKGROUND OF THE INVENTION

1. Field of the Invention

The present invention relates to a printed circuit board on which ICs are mounted, which is suitably used for electronics that are required to have a reduced noise level, such as an IC for controlling vehicle braking.

2. Description of the Related Art

Recently, various regulations have required a reduction in the noise level of ICs, a typical example of which is a central processing unit. In a conventional IC, two opposed pins (two terminals respectively disposed at opposed two sides when the IC forms a rectangle) receive a source potential and a ground potential, respectively. However, plural terminals are conventionally arranged for receiving the source potential and the ground potential in an IC, in view of noise regulations.

In such a case, because the number of required pins is increased, package size and the number of bypass-capacitors are increased. As a result, an area of a substrate occupied by the bypass-capacitors and wiring members for connecting them is increased.

Further, this effect lessens flexibility of substrate pattern design to make the noise countermeasures on the substrate difficult. As a result, the noise level may be raised on the contrary. Incidentally, it is conceivable that a multilayered substrate can solve the above-described problem; however, the multilayered substrate results in high cost.

SUMMARY OF THE INVENTION

The present invention has been made in view of the above problem. An object of the present invention is to decrease a noise level while suppressing an increase in occupied substrate area.

According to the present invention, in a printed circuit board on which a plurality of pins are arranged to form a generally polygonal shape, the pins includes a first pin as a ground terminal and a second pin as a source terminal. The ground terminal is disposed at a corner portion of the generally polygonal shape, and the source terminal adjoins the ground terminal. Further, a first conductive region extends radially from the corner portion of the polygonal shape and is electrically connected to the ground terminal.

Because the source terminal adjoins the ground terminal, a substrate area occupied by a bypass capacitor can be restricted from increasing. Further, because the ground terminal is electrically connected to the first conductive region, ground impedance can be lowered, resulting in noise reduction.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

Figure 1:
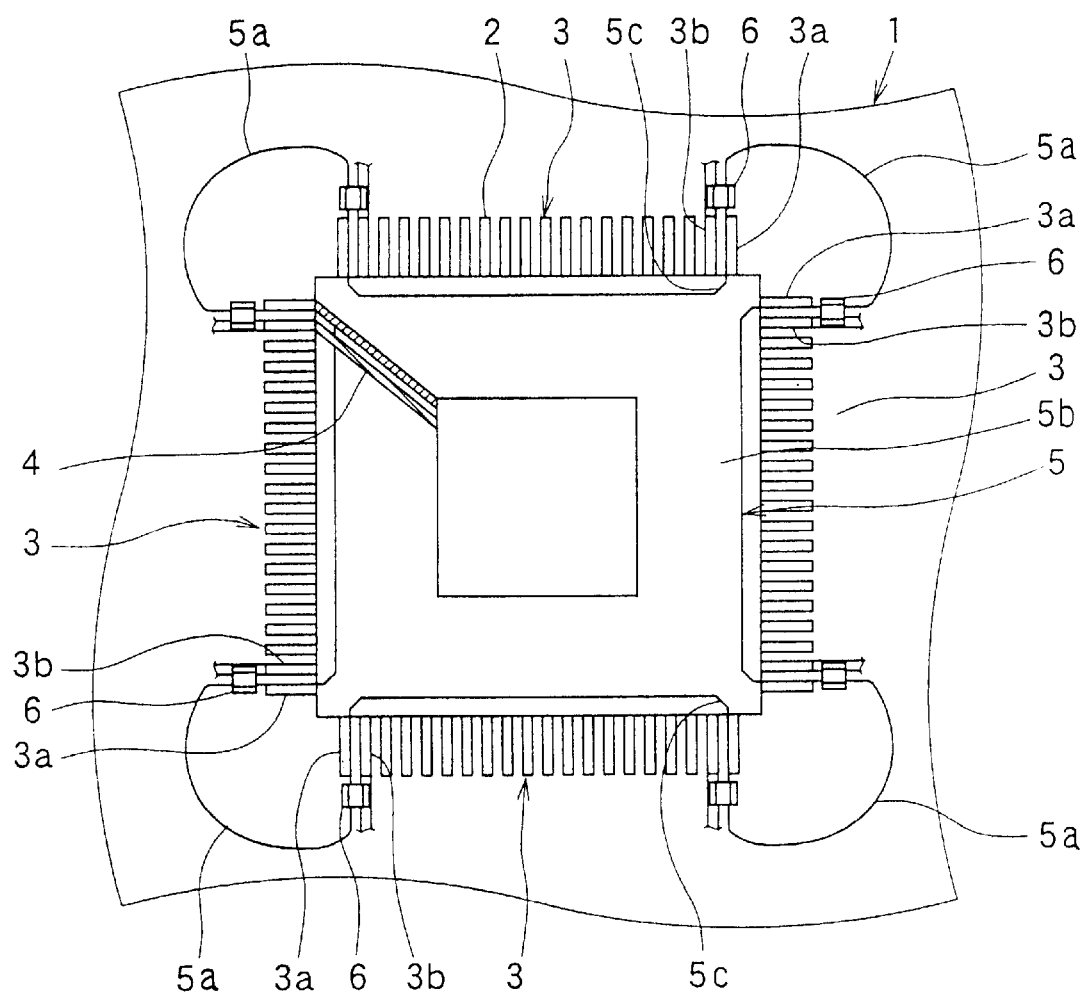
FIG. 1 is a top view showing a printed circuit board on which a QFP-IC is mounted, in a preferred embodiment of the present embodiment.

Referring to FIG. 1, in a preferred embodiment, a QFP (Quad Flat Package)-IC 2 is mounted on a printed circuit board 1. Several pins (terminals) 3 are arranged in a generally square shape on the printed circuit board 1. Each pin 3 is disposed to extend in a direction perpendicular to a corresponding side forming the square shape. These pins 3 are respectively connected to electronic parts and the like (not shown) disposed on the printed circuit board 1 and the like.

In these pins 3, pins 3a are arranged at edge portions of the respective sides constituting the generally square shape, and are used as GND terminals (ground terminals) having a ground potential. Pins 3b are disposed to adjoin the respective pins 3a, and are used as source terminals having a source potential. The pines 3a are referred to as GND terminals and the pins 3b are referred to as source terminals.

The QFP-IC 2 is mounted in the central portion of the pins 3 arranged in the generally square shape, and terminals formed with the QFP-IC 2 are electrically connected to the pins 3 through wires 4 by wire bonding. Incidentally, although FIG. 1 shows only wires connected to one GND terminal 3a and one source terminal 3b, in practice, all the pins 3 are electrically connected to the QFP-IC 2 through the wires 4.

Figure 2:
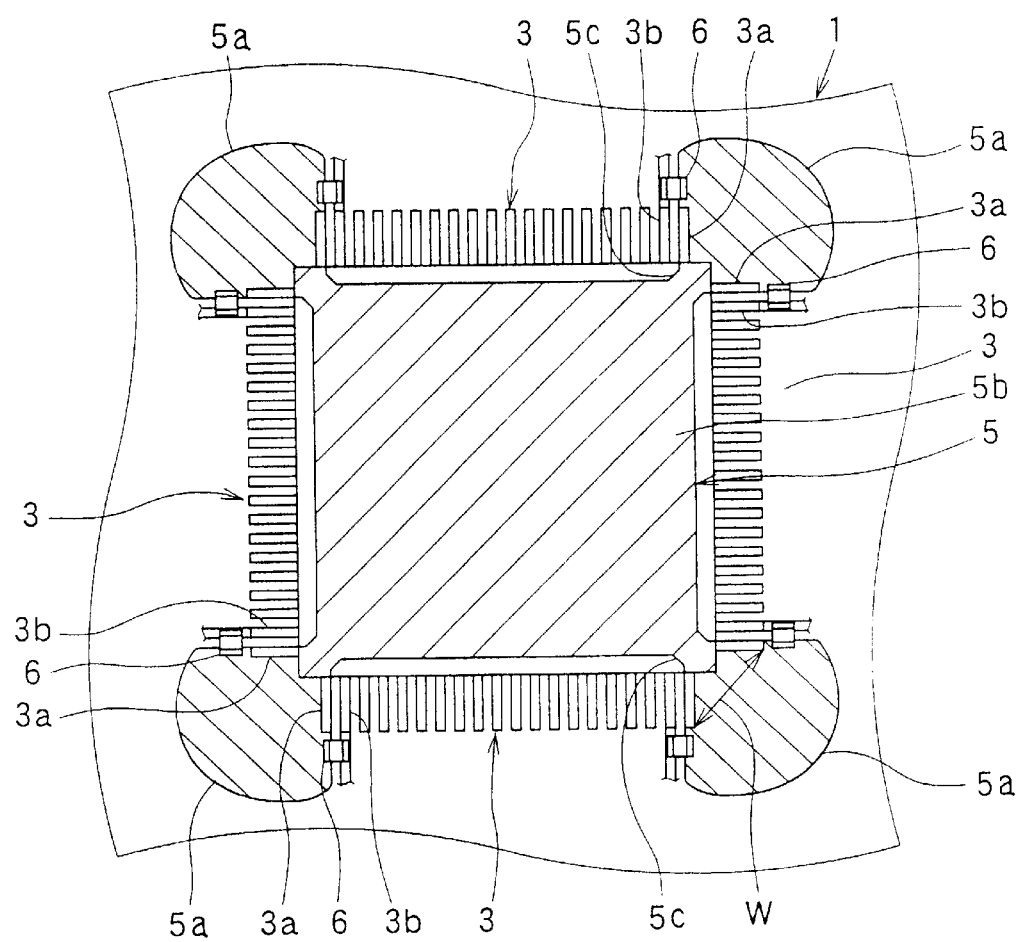
FIG. 2 is a top view showing the printed circuit board shown in FIG. 1.

A conductive pattern 5 is printed on the printed circuit board 1 to be electrically connected to the GND terminals 3a. Referring to FIG. 2, a slant portion corresponds to a region where the conductive pattern 5 is formed on the printed circuit board 1. The conductive pattern 5 is disposed, by set-solid printing, at an inside of the generally square shape formed by the pins 3, at the respective corner portions of the generally square shape, and at portions connecting these regions.

In the conductive pattern 5, conductive regions 5a disposed on the corner portions extend radially from the respective corner portions. That is, on each corner portion of the generally square shape, two GND terminals 3a are disposed to extend perpendicularly to the respective sides of the square shape and perpendicularly to each other. That is, the two GND terminals 3a define therebetween a space having an about right-angled corner, and in the space, there is no pin connected to a terminal of the QFP-IC 2. Each conductive region 5a is formed in this space by printing. Incidentally, in the present embodiment, each conductive region 5a extends radially, i.e., further outside the GND terminals 3a arranged at the edges of the sides. More specifically, the GND terminals 3a do not define a gap with the conductive region 5a disposed outside thereof.

Also, the conductive pattern 5 has a conductive region 5b disposed inside the generally square shape. The conductive region 5b is formed by printing to contain a region corresponding to almost an entire area of the generally square shape, i.e., to contain a region facing the back surface of the QFP-IC 2 shown in FIG. 1, but has a side slightly shorter than that of the generally square shape formed by the edges of the pins at the side of the QFP-IC 2.

Conductive regions 5c of the conductive pattern 5, which connect the conductive regions 5a and the conductive region 5b, are formed by printing to pass through the inside and the outside of the generally square shape formed by the pins 3, via gaps between the GND terminals 3a positioned on the respective corner portions. Each gap defined between the GND terminals 3a disposed at each corner portion may be changed in accordance with the width of the corresponding conducive region 5c. Here, the gap is set at a dimension that allows current to flow out through the conductive region 5c and that enables low impedance between the GND terminals 3a.

Further, bypass capacitors 6 are disposed between the conductive region 5a of the conductive pattern 5 and the respective source terminals 3b. Thus, because the respective source terminals 3b adjoin the respective GND terminals 3a, a length of a wiring member for each bypass capacitor 6 disposed between the terminals 3a, 3b can be made shortest. As a result, a substrate area occupied by wiring members of the bypass capacitors 6 can be prevented from increasing largely.

Connecting configurations of the bypass capacitors 6 are determined based on the size of each bypass capacitor 6 as follows.

The relation between the size of the bypass capacitor 6 and the connecting configurations is explained referring to FIGS. 3A to 3F. The connecting configurations of the bypass capacitor 6 are sorted into two cases where an arrangement direction of the neighboring GND terminal 3a and the source terminal 3b corresponds to a longitudinal direction of the bypass capacitor 6 (lateral arrangement), and where the arrangement direction is perpendicular to the longitudinal direction of the bypass capacitor 6 (lengthwise arrangement).

Figure 3A:
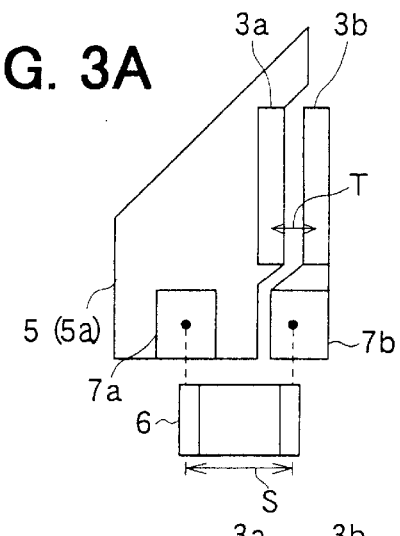
FIGS. 3A to 3F are schematic views for explaining connecting configurations of bypass capacitors.
Figure 3D:
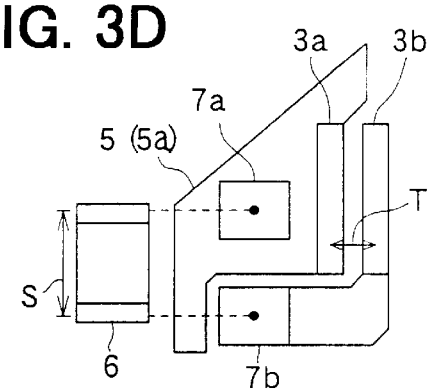
Figure 3B:
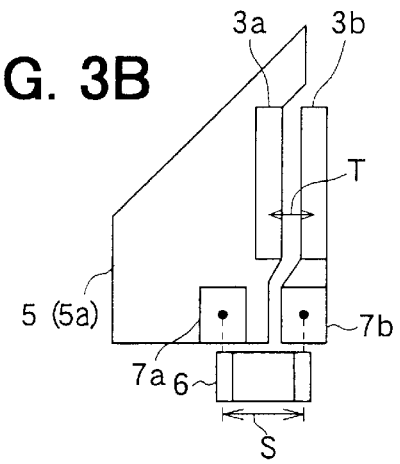
Figure 3E:
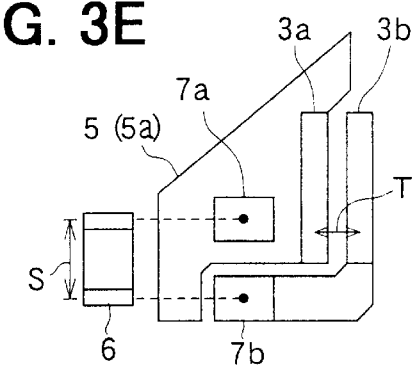
Figure 3C:
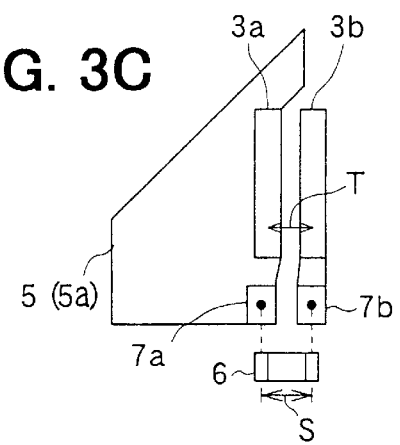
Figure 3F:
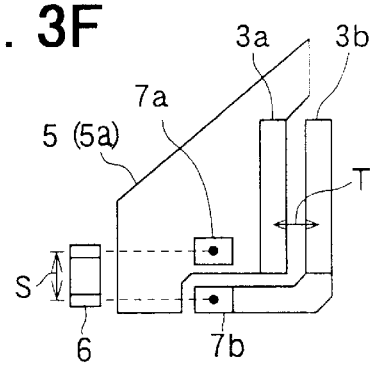

FIGS. 3A to 3F schematically show connecting configurations of bypass capacitors 6 having different sizes in the cases where each bypass capacitor is disposed at a lateral or lengthwise arrangement. Specifically, FIGS. 3A and 3D show a case where the bypass capacitor 6 has dimension S in the longitudinal direction that is sufficiently larger than interval T between the GND terminal 3a and the source terminal 3b, FIGS. 3B and 3E show a case where the dimension S is larger than the interval T, and FIGS. 3C and 3F show a case where the dimension S is approximately equal to the interval T. Further, FIGS. 3A to 3C shows the case of the lateral arrangement, while FIGS. 3D to 3F shows the case of the lengthwise arrangement.

As shown in FIGS. 3A to 3C, ends of the bypass capacitor 6 are respectively connected to a pad 7a formed with the conductive pattern 5 and a pad 7b extending from the source terminal 3b. Comparing lengths of current passes flowing from the source terminal 3b to the GND terminal 3a through the bypass capacitor 6 in the respective cases shown in FIGS. 3A to 3C, the current pass at the lengthwise arrangement is shorter than that at the lateral arrangement in the case where the dimension S of the bypass capacitor 6 is larger than the interval T between the GND terminal 3a and the source terminal 3b. On the other hand, in the case where the dimension S is approximately equal to the interval T, the current pass at the lateral arrangement is shorter than that at the lengthwise arrangement.

Because of this, the bypass capacitor 6 and the conductive pattern 5 and the source terminal 3b are electrically connected to each other with a configuration that is selected to make the current pass short based on the relation between the dimension S of the bypass capacitor 6 and the interval T between the GND terminal 3a and the source terminal 3b.

At that time, it is preferable that no via (via hole) is disposed on the current pass mainly extending between the pad 7b of the bypass capacitor 6 as a source terminal and the source terminal 3b. This is to make almost all source current pass through the vicinity of the pads 7b of the capacitor 6. A main current line from the source terminal 3b should not branch on the way toward the bypass capacitor 6. No via means no branch on the way.

The printed circuit board 1 having the above structure has the following advantages.

First, the GND terminals 3a are arranged at the corner portions of the generally square shape formed by the pins 3, and the conductive pattern 5 formed on the printed circuit board 1 is connected to the GND terminals 3a at the corner portions. Because of this, the ground impedance between the GND terminals 3a can be lowered.

Accordingly, occurrence of ground bounce can be restricted when a signal return current from the QFP-IC 2 flows, and noise propagation to other circuits can be prevented. Also, because the impedances between the GND terminals 3a of the QFP-IC 2 and between the bypass capacitors 6 can be lowered, noise produced by feed through current, which is produced in switching MOSFET and the like formed in the QFP-IC 2, can be lessened.

Because the source terminal 3b and the GND terminal 3a are disposed adjacently to each other, the mutual inductance between the respective terminals can be raised. The mutual inductance works to cancel the self-inductance. Therefore, the occurrence of a counter electromotive force by inductance can be decreased. Further, because the length of the wiring member for the bypass capacitor (decoupling capacitor) 6 can be made shortest by disposing the bypass capacitor 6 between the source terminal 3b and the GND terminal 3a adjoining each other, the ESL (parasitic serial inductance) of the capacitor can be minimized, resulting in noise reduction.

Also, the conductive region 5b is formed by set-solid printing at a region including the lower part of the QFP-IC 2, and the respective GND terminals 3a are connected to each other through the conductive region 5b, thereby achieving low impedance between the GND terminals 3a. Because of this, the GND terminals 3a can be stabilized, and the noise amount can be reduced. Further, a direct radiant quantity from the QFP-IC 2 can be reduced due to an effect of image current flowing in the conductive pattern 5 immediately under the QFP-IC 2.

Figure 4B:
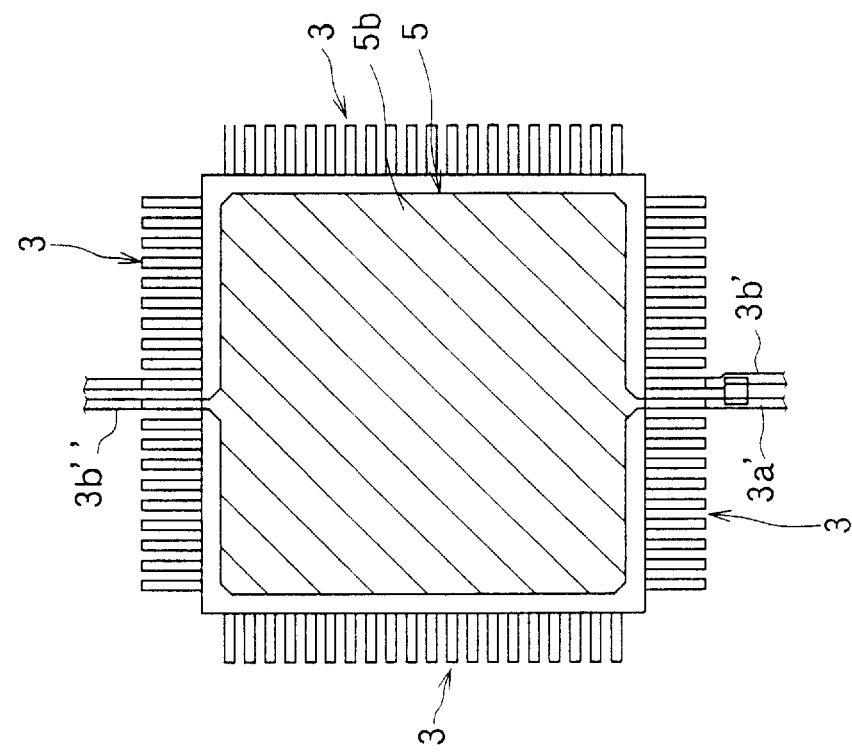
FIGS. 4A and 4B are schematic views showing samples of printed circuit boards for examining voltage fluctuations thereof.

The noise reducing effect in the case of adopting the printed circuit board 1 constructed as above was experimentally compared to a conventional one. Specifically, assuming the printed circuit board 1 in the present embodiment, a printed circuit board shown in FIG. 4A was prepared. In the printed circuit board, conductive regions 5a are provided at two corner portions of a square shape, and a square conductive region 5b is provided and connected to the conductive regions 5a through conductive regions 5c. Further, a conventional printed circuit board as shown in FIG. 4B was prepared as a comparative sample, in which neighboring two pins 3a ', 3b ', which are disposed at one side of a square shape, are set to have a source potential and a ground potential, respectively. Then, noise of the two printed circuit boards' was examined. The results are shown in FIG. 5.

This figure shows voltage fluctuations in the QFP-IC 2 with a frequency in a specific range, and the fluctuation amount corresponds to noise. In FIG. 4B, the fluctuation was measured at a grounded terminal 3b" at an opposite side of the two pins 3a ', 3b '. A solid line indicates the voltage fluctuation in the case of the printed circuit board 1 shown in FIG. 4A, and a one-dot chain line indicates the voltage fluctuation in the case of the conventional printed circuit board shown in FIG. 4B.

Figure 4A:
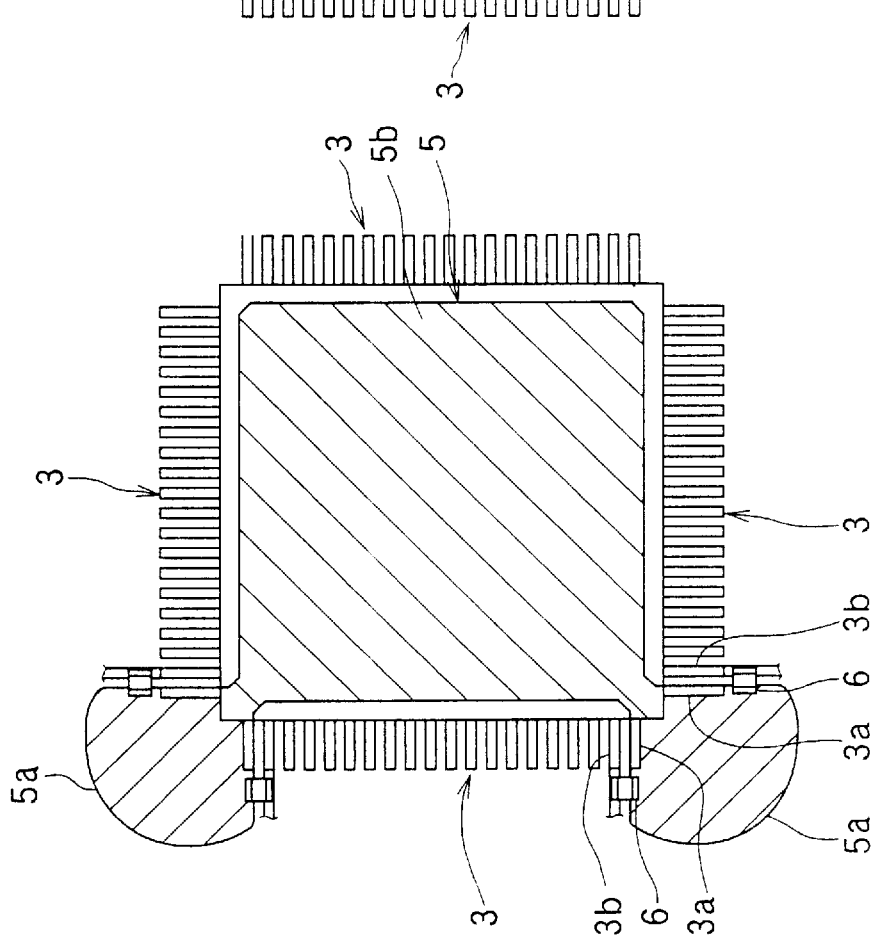
Figure 5:
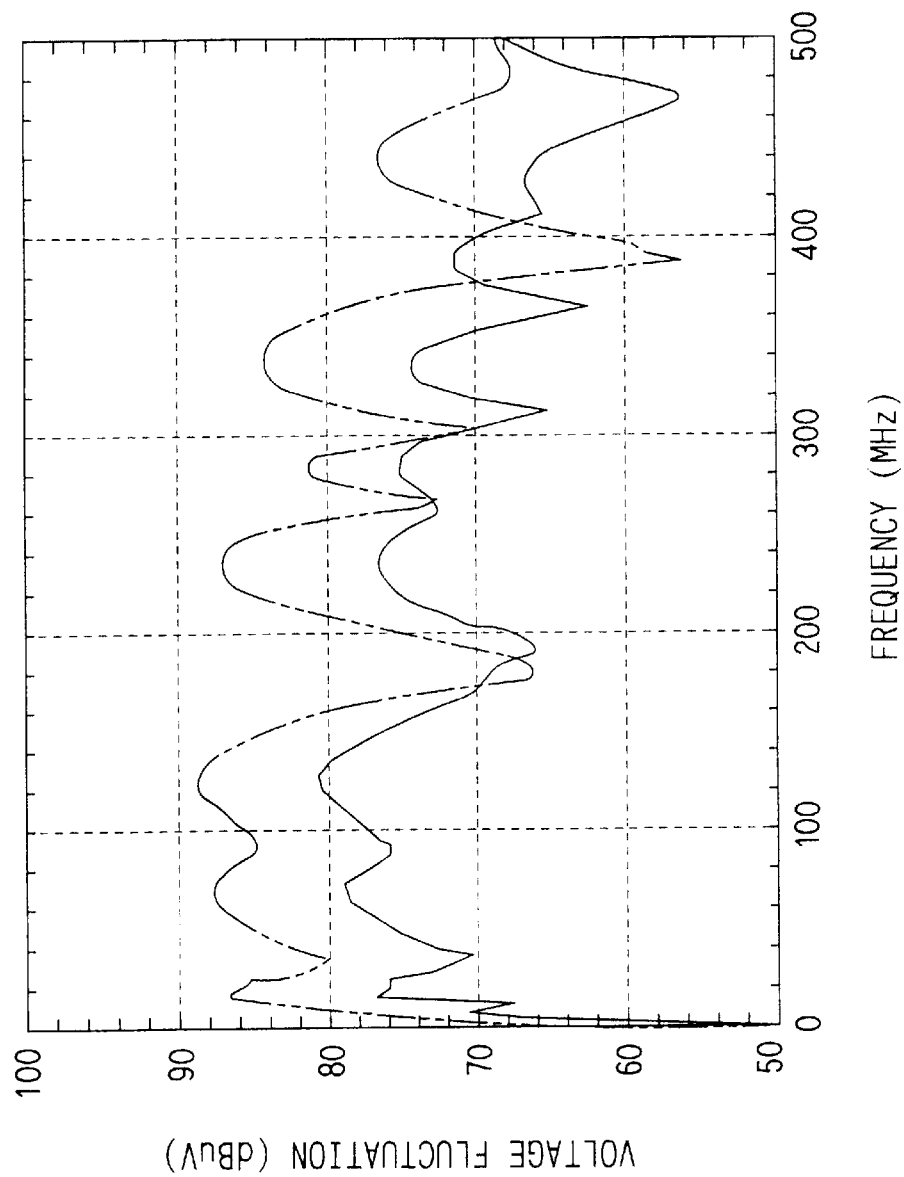
FIG. 5 is a graph showing a relation between frequency and voltage fluctuation of the printed circuit boards shown in FIGS. 4A and 4B.

According to this result, it is revealed that the noise in the case of the printed circuit board 1 shown in FIG. 4A is sufficiently reduced in comparison with the noise in the case of the conventional printed circuit board shown in FIG. 4B.

As explained above, in the printed circuit board 1 according to the present embodiment, noise can be reduced without increasing the substrate area occupied by the bypass capacitors 6 and the wiring members thereof.

Figure 6:
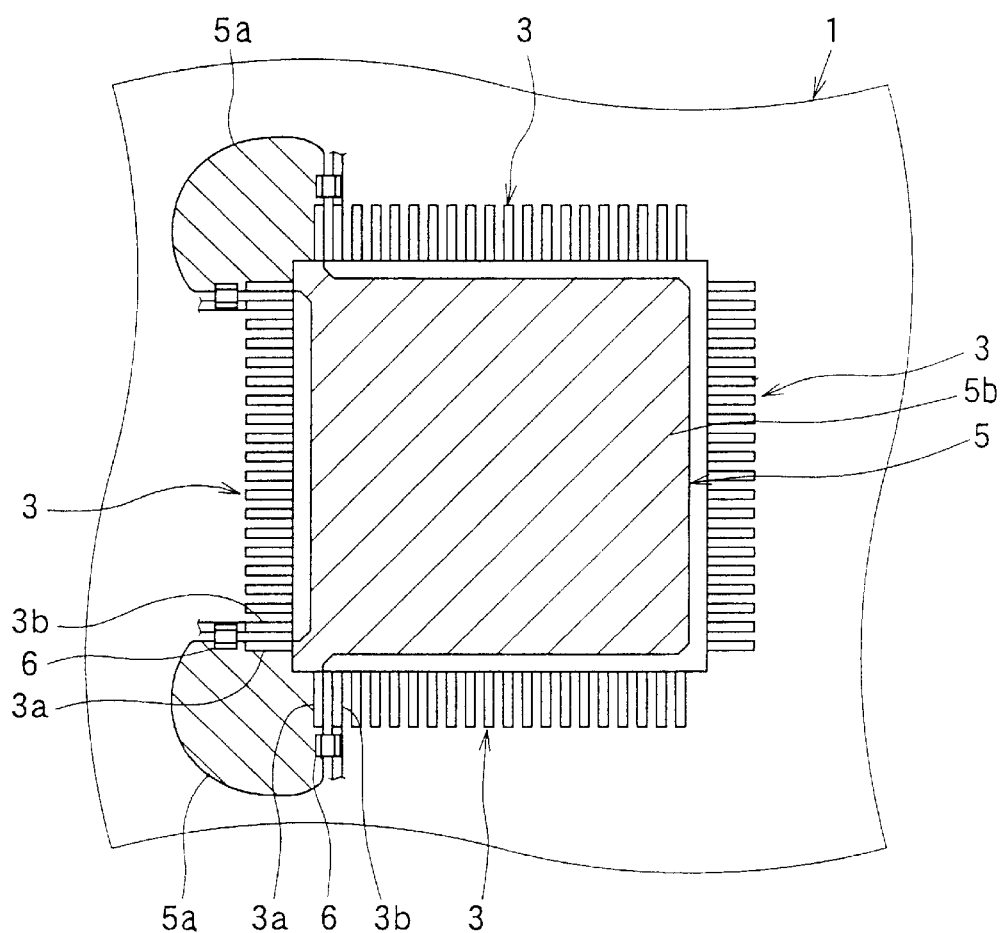
FIG. 6 is a top view showing a printed circuit board in another embodiment of the present embodiment.
Figure 7:
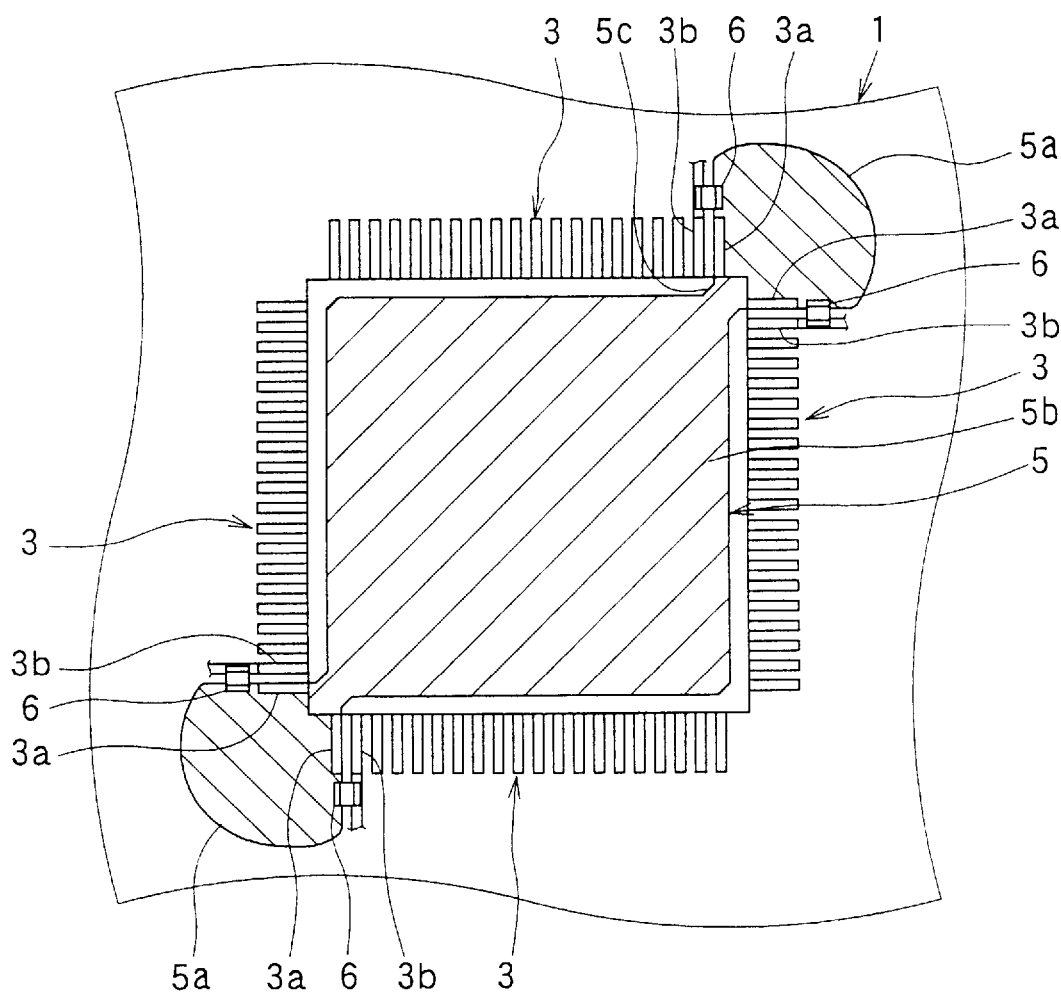
FIG. 7 is a top view showing a printed circuit board in another embodiment of the present embodiment.

In the above-described embodiment, although the radial conductive regions 5a are disposed at all the corner portions of the generally square shape formed by the several pins, it is not always necessary that all the corner portions have the radial conductive portions 5a. For example, as shown in FIG. 6, the conductive regions 5a may be formed at only two corner portions positioned at both ends of one side of the generally square shape. Otherwise, as shown in FIG. 7, the conductive regions 5a may be formed at only two corner portions diagonally disposed in the generally square shape.

Also, in the above-described embodiment, the two GND terminals 3a disposed at one corner are connected to the conductive region 5a; however, the effect of reducing the ground impedance of the GND terminals 3a can be attained by connecting at least one GND terminal 3a. In this case, it is not necessary that the conductive region 5a occupies the entire space having about 90 degrees and defined between the two terminals, and for example, about a half of the space may be occupied by the conductive region 5b. Further, the present invention is not limited to the case where respective ends of sides forming a corner portion are connected to ground terminals, but the present invention can be applied to a case where only one end may be connected to a ground terminal.

In the above-described embodiment, the conductive region 5a is radial and has an angle of about 90 degrees; however, it is not limited to this structure provided that, when the bypass capacitor 6 is disposed, the wiring width can be set at $W/2^{1/2}$ where W is the maximum length between the GND terminals 3a (FIG. 2), i.e., the conductive region 5a has a dimension in a radial direction that is approximately $W/2^{1/2}$ at least. That is, the minimum wiring width (ground width) should be secured even when the conductive regions 5a are not arranged ideally due to the various parts mounted on the printed circuit board and the layout thereon. Then, the arrangements of the bypass capacitors 6 (lengthwise arrangement, lateral arrangement) should be determined appropriately to satisfy the above relation.

Figure 8A:
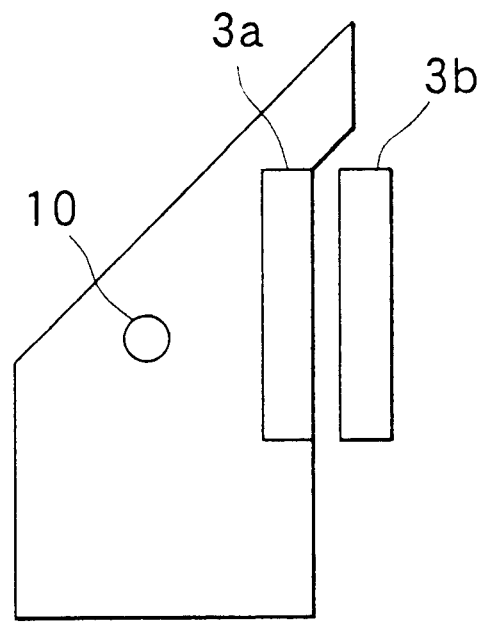
FIGS. 8A and 8B are schematic views showing modifications in which a ground via or a via for signal transmission is formed in a conductive region on the printed circuit board.
Figure 8B:
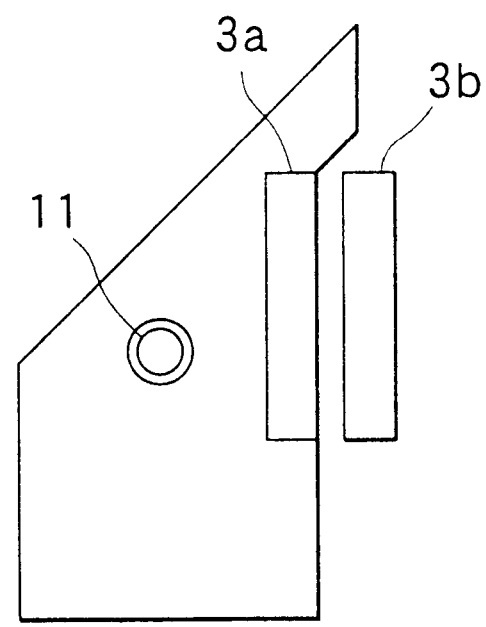

Also, as shown in FIG. 8A, a ground via 10 may be formed to electrically connect the conductive region 5a with a conductive pattern formed on another layer and having a ground potential. Further, as shown in FIG. 8B, although it does not achieve electrical connection of the conductive region 5a, a via 11 may be formed for signal transmission for achieving electrical connection between other layers (for example, between second and third layers).

Although the above-described embodiment exemplifies the case where the several pins are arranged to form a generally square shape, several pins may be arranged to form a generally polygonal shape (for example, a quadrangle) and the present invention is applicable in this case as well.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A printed circuit board for mounting an electronic part, the printed circuit board comprising:

a plurality of pins arranged on the board to form a generally polygonal shape for being electrically connected to the electronic part, the plurality of pins including at least two first pins as ground terminals and at least two second pins as source terminals, the ground terminals being disposed at a corner portion of the generally polygonal shape and being non-parallel relative to one another, the source terminal adjoining the ground terminals; and a first conductive region provided on the board and extending radially from the corner portion of the polygonal shape and electrically and directly connected to the ground terminals with no additional conductive path between the first conductive region and the ground terminals.

2. The printed circuit board according to claim 1, further comprising:

a second conductive region provided at an inside of the generally polygonal shape formed by the plurality of pins; and a third conductive region extending to pass through the corner portion and electrically connecting the first conductive region and the second conductive region.

3. The printed circuit board according to claim 1, wherein the generally polygonal shape is a generally rectangular shape.

4. The printed circuit board according to claim 1, further comprising bypass capacitors disposed between the ground terminals and the source terminals.

5. The printed circuit board according to claim 1, wherein the first conductive region has a via hole through which the first conductive region is electrically connected to a layer other than the first conductive region.

6. The printed circuit board according to claim 1, wherein the first conductive region has a via hole through which first and second layers other than the first conductive region are electrically connected to each other.

7. The printed circuit board according to claim 1, wherein the first conductive region extends at an outside of the generally polygonal shape.

8. The printed circuit board according to claim 1, wherein the at least two ground terminals are oriented generally perpendicular relative to one another.

9. The printed circuit board according to claim 3, wherein the first conductive region has an angle of about 90 degrees.

10. The printed circuit board according to claim 3, wherein at least two corner portions of the generally rectangular shape respectively have the first conductive region extending radially therefrom.

11. The printed circuit board according to claim 4, wherein each of the bypass capacitors has a pad electrically connected to the source terminal to form a current pass, the current pass being formed without a via hole thereon.

12. The printed circuit board according to claim 4, wherein:
- the corner portion of the generally polygonal shape is defined by first and second sides;
- first and second ground terminals are respectively disposed at ends of the first and second sides; and
- the first conductive region has a dimension in a radial direction thereof that is $W/2^{1/2}$ at least where W represents a maximum length between the first and second ground terminals.

13. The printed circuit board according to claim 4, wherein:
- each of the bypass capacitors is disposed with a longitudinal direction thereof that is approximately perpendicular to an arrangement direction in which the ground terminal and the source terminal are arranged, when a dimension S of the bypass capacitors in the longitudinal direction is larger than an interval T between the ground terminal and the source terminal in the arrangement direction; and
- each of the bypass capacitors is disposed with the longitudinal direction that is approximately parallel to the arrangement direction when the dimension S is approximately equal to the interval T.

14. A printed circuit board for mounting an electronic part, the printed circuit board comprising:
- a board;
- a plurality of pins arranged on the board to form a generally polygonal shape for being electrically connected to the electronic part, the plurality of pins including a first set of pins as ground terminals and a second set of pins as source terminals, the ground terminals being disposed at a corner portion of the generally polygonal shape and being non-parallel relative to one another, the source terminals adjoining the ground terminals; and
- a first conductive region extending radially from the corner portion of the polygonal shape and electrically and directly connected to the ground terminals with no additional conductive path between the first conductive region and the ground terminals.

15. The printed circuit board according to claim 14, further comprising:
- a second conductive region provided at an inside of the generally polygonal shape formed by the plurality of pins; and
- a third conductive region extending to pass through the corner portion and electrically connecting the first conductive region and the second conductive region.

16. The printed circuit board according to claim 14, wherein the generally polygonal shape is a generally rectangular shape.

17. The printed circuit board according to claim 14, further comprising a bypass capacitor disposed between the ground terminals and the source terminals.

18. The printed circuit board according to claim 14, wherein the first conductive region has a via hole through which the first conductive region is electrically connected to a layer other than the first conductive region.

19. The printed circuit board according to claim 14, wherein the first conductive region has a via hole through which first and second layers other than the first conductive region are electrically connected to each other.

20. The printed circuit board according to claim 14, wherein the first conductive region extends at an outside of the generally polygonal shape.

21. The printed circuit board according to claim 14, wherein the at least two ground terminals are oriented generally perpendicular relative to one another.

22. The printed circuit board according to claim 17, wherein each of the bypass capacitors has a pad electrically connected to the source terminals to form a current pass, the current pass being formed without a via hole thereon.

23. The printed circuit board according to claim 16, wherein the first conductive region has an angle of about 90 degrees.

24. The printed circuit board according to claim 16, wherein at least two corner portions of the generally rectangular shape respectively have the first conductive region extending radially therefrom.

25. The printed circuit board according to claim 17, wherein:
- the corner portion of the generally polygonal shape is defined by first and second sides;
- first and second ground terminals are respectively disposed at ends of the first and second sides; and
- the first conductive region has a dimension in a radial direction thereof that is at least $W/2^{1/2}$ where W represents a maximum length between the first and second ground terminals.

26. The printed circuit board according to claim 25, wherein:
- each of the bypass capacitors is disposed with a longitudinal direction thereof that is approximately perpendicular to an arrangement direction in which the ground terminals and the source terminals are arranged, when a dimension S of the bypass capacitor in the longitudinal direction is larger than an interval T between the ground terminals and the source terminals in the arrangement direction; and
- each of the bypass capacitors is disposed with the longitudinal direction that is approximately parallel to the arrangement direction when the dimension S is approximately equal to the interval T.

27. A printed circuit board for mounting an electronic part, the printed circuit board comprising:
- a board;
- a plurality of pins arranged on the board to form a generally polygonal shape for being electrically connected to the electronic part, the plurality of pins including at least two first pins as ground terminals and at least two second pins as source terminals, the ground terminals being disposed at a corner portion of the generally polygonal shape and being non-parallel relative to one another, the source terminal adjoining the ground terminals; and
- a first conductive region extending and diverging radially from the corner portion at which the ground terminals are disposed, and being electrically and directly connected to the ground terminals with no additional conductive path between the first conductive region and the ground terminals.

28. The printed circuit board according to claim 27, wherein the first conductive region is significantly wider than each of the plurality of pins.

29. The printed circuit board according to claim 27, wherein the first conductive region is continuously formed with the ground terminal.

30. The printed circuit board according to claim 27, wherein the at least two ground terminals are oriented generally perpendicular relative to one another.

* * * * *